US012648427B2

(12) United States Patent
Lee et al.

(10) Patent No.: US 12,648,427 B2
(45) Date of Patent: Jun. 2, 2026

(54) ELECTRONIC DEVICE WITH POWER REGULATING CIRCUIT

(71) Applicant: Advanced Semiconductor Engineering, Inc., Kaohsiung (TW)

(72) Inventors: Pao-Nan Lee, Kaohsiung (TW); Syu-Tang Liu, Kaohsiung (TW); Yu-Hsun Chang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 384 days.

(21) Appl. No.: 18/211,222

(22) Filed: Jun. 16, 2023

(65) Prior Publication Data

US 2024/0421086 A1     Dec. 19, 2024

(51) Int. Cl.
  H01L 23/528 (2006.01)
  H01L 25/065 (2023.01)
  H10W 20/41 (2026.01)
  H10W 90/00 (2026.01)

(52) U.S. Cl.
  CPC ......... H10W 20/427 (2026.01); H10W 90/00 (2026.01)

(58) Field of Classification Search
  CPC ..................... H01L 25/0652; H01L 23/5286
  See application file for complete search history.

(56) References Cited

U.S. PATENT DOCUMENTS

| 8,987,868 | B1 * | 3/2015 | Rahman | .................. | H01L 25/18 |
| | | | | | 326/38 |
| 2019/0164893 | A1 * | 5/2019 | Kim | .................. | H01L 23/49827 |
| 2022/0173046 | A1 * | 6/2022 | Gomes | ................ | H01L 23/5286 |
| 2023/0163077 | A1 * | 5/2023 | Lee | ...................... | H01L 23/5384 |
| | | | | | 257/774 |
| 2023/0387762 | A1 * | 11/2023 | Waltrich | ............. | H01L 23/3121 |
| 2024/0421086 | A1 * | 12/2024 | Lee | .......................... | H01L 25/18 |

OTHER PUBLICATIONS

U.S. Appl. No. 17/966,698, filed Oct. 14, 2022, Lee et al.

* cited by examiner

*Primary Examiner* — Steven M Page
(74) *Attorney, Agent, or Firm* — Foley and Lardner LLP

(57) ABSTRACT

An electronic device is disclosed. The electronic device includes a first electronic component, a second electronic component, and a circuit structure. The circuit structure is supported by the first electronic component and the second electronic component. The circuit structure electrically connects the first electronic component to the second electronic component and is configured to provide the first electronic component and the second electronic component with a power.

4 Claims, 8 Drawing Sheets

ELECTRONIC DEVICE WITH POWER REGULATING CIRCUIT

BACKGROUND

1. Field of the Disclosure

The present disclosure generally relates to an electronic device.

2. Description of the Related Art

Power supply units with low power consumption and high heat dissipation are in demand for high performance computing (HPC) systems of an electronic device. Power routing paths for transmitting power signals are usually provided by a system board, over which several dies are mounted. Layout design may be constrained by the need to minimize electromagnetic interference between power signals and non-power signals (e.g., electrical signals), which can limit the ability to miniaturize the system board.

The voltage and power requirements of the dies vary, and the rapid increase in the total number and variety of dies has led to a corresponding increase in the number of power routing paths. One approach to providing more stabilized power routing paths is to provide power through the power regulating components over an interconnection structure or an interconnection die. However, this may increase the size of the electronic device and place further constraints on the level of miniaturization of the electronic device that can be achieved.

SUMMARY

In some embodiments, an electronic device includes a first electronic component, a second electronic component, and a circuit structure. The circuit structure is supported by the first electronic component and the second electronic component. The circuit structure electrically connects the first electronic component to the second electronic component and is configured to provide the first electronic component and the second electronic component with a power.

In some embodiments, an electronic device includes a first electronic component, an interconnection circuit, and a second electronic component. The interconnection circuit is adjacent to the first electronic component. The second electronic component has a front surface for transmitting a non-power signal and a backside surface for receiving a first power signal. The second electronic component is electrically connected to the first electronic component through the backside surface of the second electronic component and the interconnection circuit.

In some embodiments, an electronic device includes a first electronic component and an integrated circuit. The first electronic component has a front surface and a backside surface opposite to the front surface. The integrated circuit is configured to provide the first electronic component with a power signal through a backside surface of the first electronic component and configured to bridge a non-power signal between the first electronic component and a second electronic component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
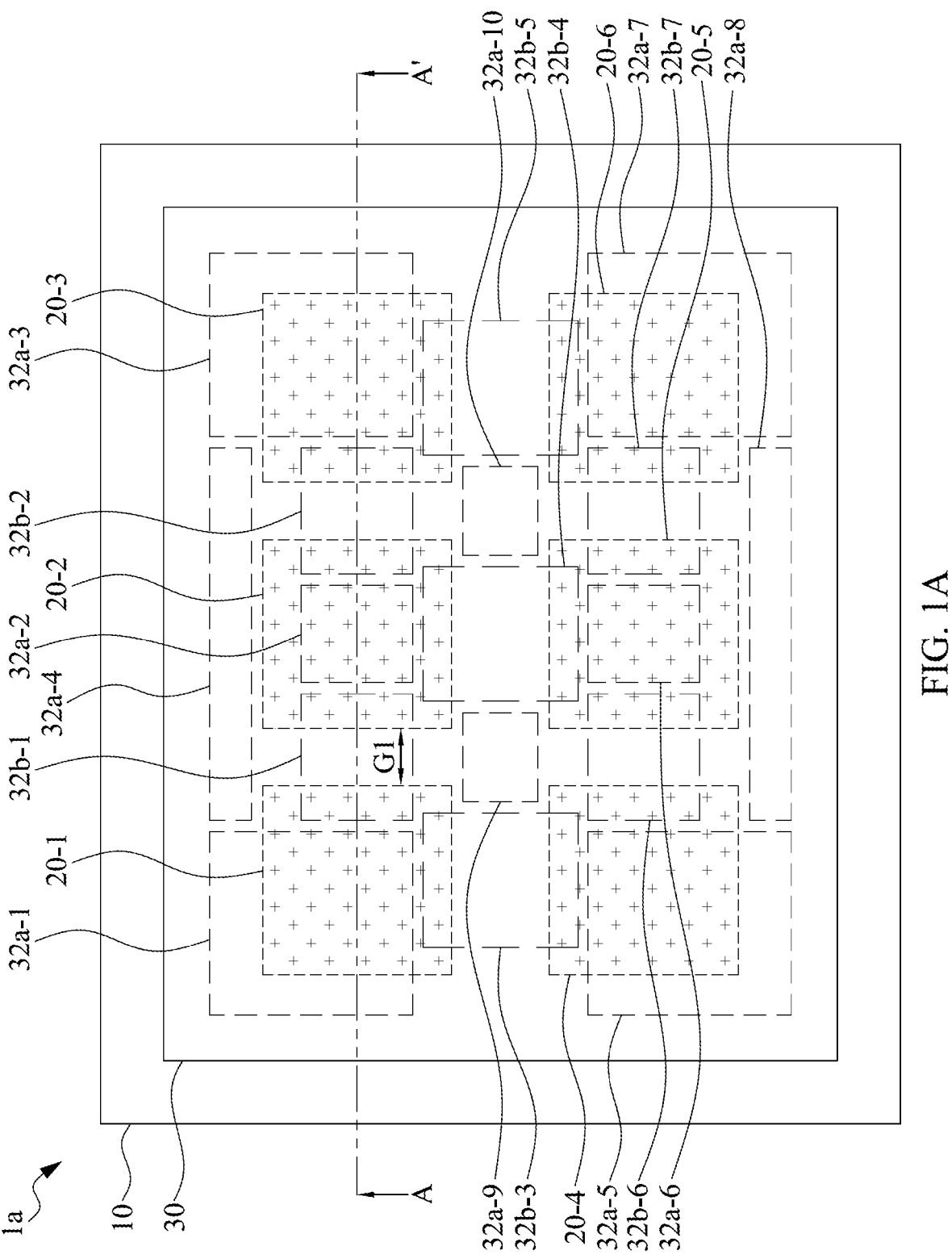
FIG. 1A illustrates a top view of an example electronic device according to some embodiments of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

Figure 1B:
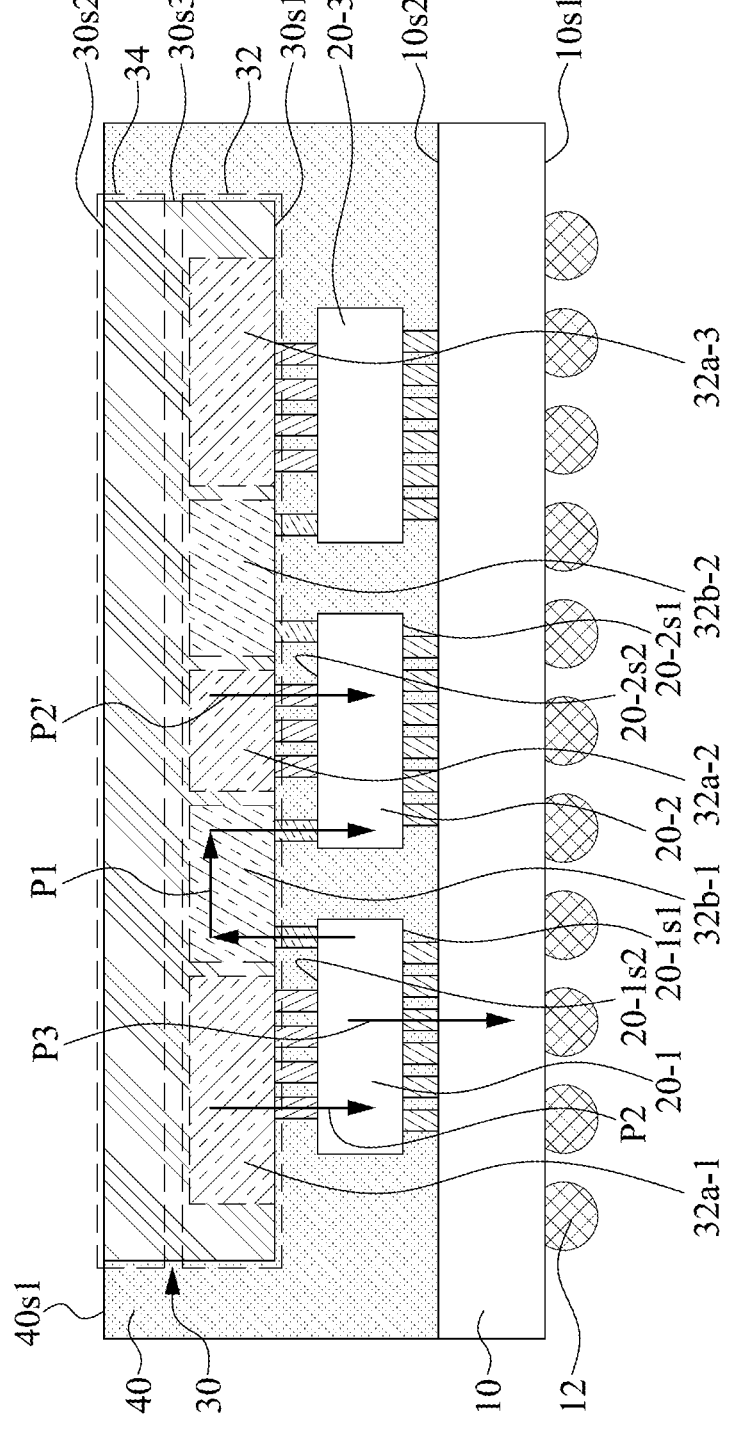
FIG. 1B illustrates a cross-sectional view of the electronic device as shown in FIG. 1A according to some embodiments of the present disclosure.

FIG. 1A and FIG. 1B illustrate an example electronic device 1a according to some embodiments of the present disclosure, wherein FIG. 1A is a top view, and FIG. 1B is a cross-sectional view along the line A-A' of FIG. 1A. In some embodiments, the electronic device 1a may include a computer system or may be a part of a computer system. The electronic device 1a may be provided to suit different requirements, depending on the intended use of the computer system. For example, the electronic device 1a may be implemented for data transfer, data processing, data management and maintenance, sensors, and other functions. In some embodiments, the electronic device 1a may include a carrier 10, electronic components 20-1, 20-2, 20-3, 20-3, 20-4, 20-5, and 20-6, a semiconductor die 30, as well as an encapsulant 40.

As shown in FIG. 1A, the semiconductor die 30 may include an active components, such as ICs. In some embodiments, the semiconductor die 30 may include power regulating circuits 32*a*-1, 32*a*-2, 32*a*-3, 32*a*-4, 32*a*-5, 32*a*-6, 32*a*-7, 32*a*-8, 32*a*-9, and 32*a*-10 as well as interconnection circuits 32*b*-1, 32*b*-2, 32*b*-3, 32*b*-4, 32*b*-5, 32*b*-6, and 32*b*-7. In some embodiments, the power regulating circuits 32*a*-1, 32*a*-2, and 32*a*-3 as well as the interconnection circuits 32*b*-1 and 32*b*-2 may be arranged alternatively. For example, the interconnection circuit 32*b*-1 may be disposed between the power regulating circuits 32*a*-1 and 32*a*-2. In some embodiments, some of the power regulating circuits 32*a*-1 to 32*a*-10 may cover only one of the chips. For example, the power regulating circuit 32*a*-1 may cover the electronic component 20-1 and be free from vertically overlapping other electronic components 20-2 to 20-6. In some embodiments, some of the power regulating circuits 32*a*-1 to 32*a*-10 may be free from overlapping the chips. For example, the power regulating circuit 32*a*-9 may be free from overlapping the electronic components 20-1 to 20-6. In some embodiments, some of the power regulating circuits 32*a*-1 to 32*a*-10 may be located at a relatively peripheral region or closer to the corner (or edge) of the semiconductor die 30. For example, the power regulating circuits 32*a*-1, 32*a*-3, 32*a*-4, 32*a*-6, 32*a*-7, and 32*a*-8 are closer to the edge (or side) of the semiconductor die 30. In some embodiments, the power regulating circuits 32*a*-1 to 32*a*-10 may have different dimensions (e.g., areas). For example, the area of the power regulating circuit 32*a*-2 may be less than that of the power regulating circuit 32*a*-1. The number of the power regulating circuits 32*a*-1 to 32*a*-10 is not intended to limit the present disclosure. In some embodiments, the number and dimensions of the power regulating circuits 32*a*-1 to 32*a*-10 may be modified and/or controlled depending on design requirements.

Each of the interconnection circuits 32*b*-1 to 32*b*-7 may be spaced apart from the power regulating circuits 32*a*-1 to 32*a*-10. In some embodiments, some of the interconnection circuits 32*b*-1 to 32*b*-7 may cover at least two electronic components (or chips). For example, the interconnection circuit 32*b*-1 may cover the electronic components 20-1 and 20-2; the interconnection circuit 32*b*-3 may cover the electronic components 20-1 and 20-4. In some embodiments, some of the interconnection circuits 32*b*-1 to 32*b*-7 may be positioned or disposed across the gap defined by two adjacent electronic components (or chips). For example, the interconnection circuit 32*b*-1 may be positioned across the gap G1 between the electronic components 20-1 and 20-2. In some embodiments, some of the interconnection circuits 32*b*-1 to 32*b*-7 may be located at a relatively central region or further away from the corner (or edge) of the semiconductor die 30. In some embodiments, each of the interconnection circuits 32*b*-1 to 32*b*-7 may be disposed between two or among three or more power regulating circuits 32*a*-1 to 32*a*-10. In some embodiments, some of the power regulating circuits 32*a*-1 to 32*a*-10 may be surrounded by some of the interconnection circuits 32*b*-1 to 32*b*-7. For example, the power regulating circuit 32*a*-9 may be surrounded by the interconnection circuits 32*b*-1, 32*b*-3, 32*b*-4, and 32*b*-6. In some embodiments, the interconnection circuits 32*b*-1 to 32*b*-7 may have different dimensions (e.g., areas). For example, the area of the interconnection circuit 32*b*-1 may be less than that of the interconnection circuit 32*b*-3. The number of the interconnection circuits is not intended to limit the present disclosure. In some embodiments, the number and dimensions of the interconnection circuits 32*b*-1 to 32*b*-7 may be modified and/or controlled depending on design requirements.

As shown in FIG. 1B, the carrier 10 may be configured to support the electronic components (or chips) 20-1, 20-2, and 20-3 and the semiconductor die 30. The carrier 10 may include a system board, a main board, a main printed circuit board (PCB) or other suitable carriers. The carrier 10 may include an interconnection structure, such as a redistribution layer (RDL), a circuit layer, a conductive trace, a conductive via, etc. The interconnection structure may provide signal paths for other components electrically connected to the carrier 10. For example, the carrier 10 may facilitate and allow communications among the components mounted over it. In some embodiments, the carrier 10 may receive and/or transmit a non-power signal (e.g., I/O signals) from the electronic component 20-1, 20-2, and/or 20-3. In some embodiments, the carrier 10 may receive and/or transmit a power signal toward the electronic component 20-1, 20-2, and/or 20-3. The carrier 10 may have a surface 10*s*1 (or a lower surface) and a surface 10*s*2 (or an upper surface) opposite to the surface 10*s*1. In some embodiments, the carrier 10 may include a circuit (not shown) configured to provide power paths and transmit power through the surface 10*s*2.

The electronic device 1*a* may include electrical connectors 12. The electrical connector 12 may be disposed on or under the surface 10*s*1 of the carrier 10. The electrical connector 12 may be electrically connected to an external device (not shown). The electrical connector 12 may include a solder ball, such as a controlled collapse chip connection (C4) bump, a ball grid array (BGA), a land grid array (LGA), and so on. The electrical connector 12 may include a solder material, which may include alloys of gold and tin solder or alloys of silver and tin solder, or other suitable materials.

Each of the electronic components 20-1, 20-2, and 20-3 may be disposed on or over the surface 10*s*2 of the carrier 10. Each of the electronic components 20-1, 20-2, and 20-3 may include a chip. In some arrangements, each of the electronic components 20-1, 20-2, and 20-3 may include an active component that relies on an external power supply to control, output, or modify electrical signals. For example, the electronic components 20-1, 20-2, and 20-3 may each include a processor, a controller, a memory, or an input/output (I/O) buffer, etc. Each of the electronic components 20-1, 20-2, and 20-3 may include a system on chip (SoC), a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. Each of the electronic components 20-1, 20-2, and 20-3 may include a lower surface and an upper surface. For example, the electronic component 20-1 may include a surface 20-1*s*1 (or a lower surface or a front surface) and a surface 20-1*s*2 (or an upper surface or a backside surface). The electronic component 20-2 may include a surface 20-2*s*1 (or a lower surface or a front surface) and a surface 20-2*s*2 (or an upper surface or a backside surface). In some embodiments, the front surface of the electronic components 20-1, 20-2, and 20-3 may be configured to transmit input/output (I/O) signal, which may include or be composed of alternating current (AC). In some embodiments, the backside surface of the electronic components 20-1, 20-2, and 20-3 may be configured to receive power, which may include or be composed of direct current (DC). In some embodiments, the backside surface of the electronic components 20-1, 20-2, and 20-3 may be config-ured to transmit and/or receive signal, which may include or be composed of AC, in communication between and/or among chips. Although not illustrated and described in FIG. 1, the location, structure, and function of the electronic components 20-4, 20-5, and 20-6 may be the same as or similar to those of the electronic component 20-1. Each of the electronic components 20-1, 20-2, and 20-3 may have terminals on the front surface and backside surface, which will be detailed in FIG. 2 and FIG. 3.

In some embodiments, the semiconductor die 30 may be disposed on or over the backside surface of the electronic components 20-1, 20-2, and 20-3. For example, the semi-conductor die 30 may be disposed on or over the surface 20-1s2 of the electronic component 20-1. In some embodi-ments, the semiconductor die 30 may be connected to the electronic components 20-1 to 20-3 by a solder bonding(s), a conductive pillar(s) (e.g., copper pillar), or a combination thereof. In some embodiments, the semiconductor die 30 may include a circuit structure(s) configured to transmit and/or receive a power signal and/or a non-power signal. In some embodiments, the semiconductor die 30 may function as an interposer that is included in a signal path or a power path. In some embodiments, the semiconductor die 30 may be configured to provide the electronic components 20-1, 20-2, and 20-3 with power. In some embodiments, the semiconductor die 30 may be configured to electrically connect the electronic component 20-1, 20-2, and/or 20-3. The semiconductor die 30 may include a surface 30s1 (or a lower surface or a front surface), a surface 30s2 (or an upper surface of a backside surface) opposite to the surface 30s1, and a surface 30s3 (or a lateral surface) extending between the surface 30s1 and surface 30s2. In some embodiments, the surface 30s1 of the semiconductor die 30 may be configured to transmit power to the electronic components 20-1, 20-2, and 20-3. In some embodiments, the surface 30s1 of the semiconductor die 30 may be configured to transmit signal that is in communication between or among the electronic component 20-1, 20-2, and/or 20-3.

In some embodiments, the semiconductor die 30 may include a semiconductor substrate, which may include sili-con, germanium or other suitable materials. In some embodiments, the semiconductor die 30 may include a circuit region 32 and a rigid region 34. In some embodi-ments, the circuit region 32 is closer to the surface 30s1 of the semiconductor die 30 than the rigid region 34 is. The circuit region 32 may include the power regulating circuits 32a-1, 32a-2, and 32a-3. Each of the power regulating circuits 32a-1, 32a-2, and 32a-3 may be configured to transmit a regulated power to the electronic component 20-1, 20-2, and/or 20-3. In some embodiments, the power regulating circuits 32a-1, 32a-2, and 32a-3 may include a passive device, such as a capacitor structure (e.g., deep trench capacitor), inductor, resistor, filter, or a combination thereof. The power regulating circuits 32a-1, 32a-2, and 32a-3 may be circuits or circuit elements that do not provide electrical gain. In some embodiments, the power regulating circuit 32a-1 may be located directly over the electronic component 20-1, which may reduce a transmission path of power. Therefore, the voltage drop or the power loss of the power path can be decreased. Although not illustrated and described in FIG. 1B, the structure and function of the power regulating circuits 32a-4 to 32a-10 may be the same as or similar to those of the power regulating circuits 32a-1.

The circuit region 32 may include the interconnection circuits 32b-1 and 32b-2. Each of the interconnection cir-cuits 32b-1 and 32b-2 may be configured to transmit signal from one electronic component (or chip) to another elec-tronic component (or chip). For example, the interconnec-tion circuit 32b-1 may receive signal from the electronic component 20-1 and transmit said signal to the electronic component 20-2. For example, the interconnection circuit 32b-1 may bridge the signals (non-power signal) between the electronic components 20-1 and 20-2. Although not illustrated and described in FIG. 1B, the structure and function of the interconnection circuit 32b-3 to 32b-7 may be the same as or similar to those of the interconnection circuit 32b-1.

In some embodiments, the rigid region 34 is closer to the surface 30s2 than the circuit region 32 is. In some embodi-ments, the rigid region 34 may be configured to support the circuit region 32. In some embodiments, the rigid region 34 may be more robust than the circuit region 32 is because the structure of the semiconductor substrate of the rigid region 34 is less destroyed in comparison with the circuit region 32. In some embodiments, the rigidity of the rigid region 34 may be greater than that of the circuit region 32. In some embodiments, the ratio of silicon (or the component of the semiconductor substrate, such as a semiconductor material, of the semiconductor die 30) of the rigid region 34 may be greater than the ratio of silicon of the circuit region 32. In some embodiments, the density of conductive elements (e.g., conductive layer(s), conductive trace(s), conductive pad(s), and/or conductive via(s)) of the rigid region 34 is less than the density of conductive elements (e.g., conductive layer(s), conductive trace(s), conductive pad(s), and/or con-ductive via(s)) of the circuit region 32. In some embodi-ments, no conductive elements (e.g., conductive layer(s), conductive trace(s), conductive pad(s), and/or conductive via(s)) is formed within the rigid region 34. In some embodi-ments, the thickness of the rigid region 34 may be greater than, equal to, or less than the thickness of the thickness of the circuit region 32.

In some embodiments, the encapsulant 40 may be dis-posed on or over the surface 10s2 of the carrier 10. In some embodiments, the encapsulant 40 may encapsulate the elec-tronic components 20-1, 20-2, and 20-3. In some embodi-ments, the encapsulant 40 may encapsulate the semiconduc-tor die 30. In some embodiments, the encapsulant 40 may be in contact with the surface 30s3 of the semiconductor die 30. The encapsulant 40 may have a surface 40s1 (or an upper surface) spaced apart from the carrier 10. In some embodi-ments, the surface 40s1 of the encapsulant 40 may be substantially coplanar or aligned with the surface 30s2 of the semiconductor die 30. The encapsulant 40 may include insulation or dielectric material. In some embodiment, the encapsulant 40 may be made of molding material that may include, for example, a Novolac-based resin, an epoxy-based resin, a silicone-based resin, or other another suitable encapsulant. Suitable fillers may also be included, such as powdered $SiO_2$.

As shown in FIG. 1B, the semiconductor die 30 may be configured to provide a path P1. The path P1 may be a non-power path. In some embodiments, the path P1 may pass through the backside surfaces of the electronic com-ponents 20-1 to 20-6 and the interconnection circuits 32b-1 to 32b-7. For example, the path P1 may pass through the surface 20-1s2 of the electronic component 20-1, the inter-connection circuit 32b-1, and the surface 20-2s2 of the electronic component 20-2.

The semiconductor die 30 may be configured to provide a path P2. The path P2 may be a power path. In some embodiments, the path P2 may pass through the backside surfaces of the electronic components 20-1 to 20-6 and the power regulating circuits 32a-1 to 32a-10. For example, the path P2 may pass through the power regulating circuit 32a-1, the surface 30s1 of the semiconductor die 30, and the surface 20-1s2 of the electronic component 20-1. The semiconductor die 30 may be configured to provide a path P2'. The path P2' may be a power path. In some embodiments, the path P2' may pass through the backside surfaces of the electronic components 20-1 to 20-6 and the power regulating circuits 32a-1 to 32a-10. For example, the path P2' may pass through the power regulating circuit 32a-2, the surface 30s1 of the semiconductor die 30, and the surface 20-2s2 of the electronic component 20-2. In some embodiments, the power of the path P2 may be the same as the power of the path P2'. In some embodiments, the power of the path P2 may be different from the power of the path P2'.

Each of the electronic components 20-1, 20-2, and 20-3 may be configured to provide a path P3. The path P3 may include a non-power path, such as an I/O signal path. For example, the path P3 may pass through the surface 20-1s1 of the electronic component 20-1 and the surface 10s2 of the carrier 10.

In a comparative example, the power regulating circuit (or component) is mounted on a power board or on an interconnection die. Such design may increase the size (e.g., thickness) of an electronic device and increase the transmission path of a power path. In this embodiment, the power regulating circuit and the interconnection circuit are integrated in a semiconductor die, which may reduce the size (e.g., the thickness) of an electronic device. Further, the power path may also be reduced to decrease voltage drop and/or power loss.

Figure 2:
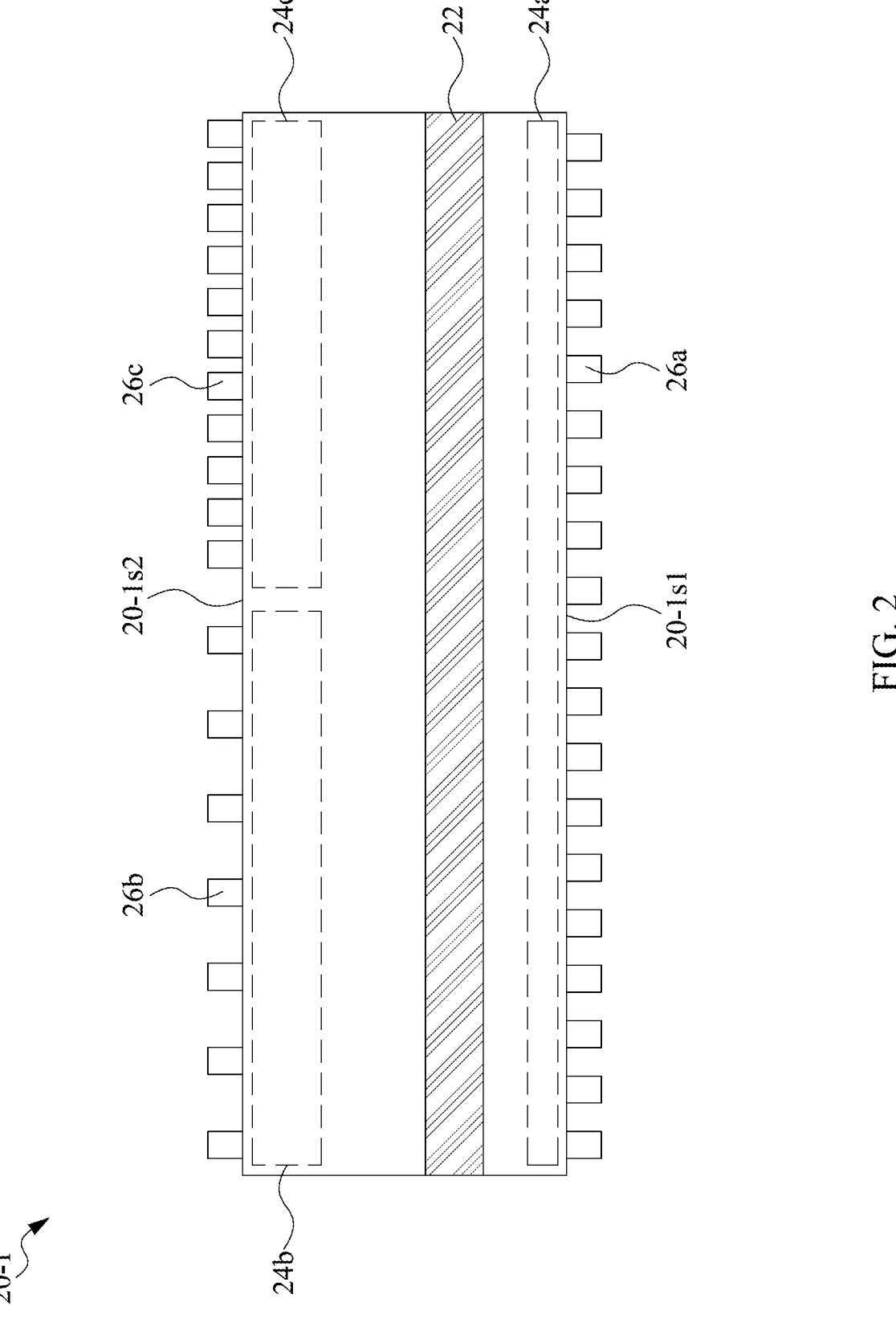
FIG. 2 illustrates a cross-sectional view of an electronic component according to some embodiments of the present disclosure.

FIG. 2 illustrates a cross-sectional view of the electronic component 20-1 according to some embodiments of the present disclosure. In some embodiment, the electronic component 20-1 shown in FIG. 2 may be applied to the electronic components 20-1 to 20-6 as shown in FIGS. 1A and 1B.

In some embodiments, the electronic component 20-1 may have an integrated circuit layer 22 (or IC layer) within the substrate of the electronic component 20-1. In some embodiments, the IC layer 22 may include active devices such as transistors and/or passive devices such as resistors, capacitors, inductors, or a combination thereof. For example, the IC layer 22 may include an application-specific IC (ASIC), a radio frequency integrated circuit (RFIC), a central processing unit (CPU), a microprocessor unit (MPU), a graphics processing unit (GPU), a microcontroller unit (MCU), a field-programmable gate array (FPGA), or another type of IC. In some embodiments, the IC layer 22 may be configured to receive power that passes through the path P2 as shown in FIG. 1B. In some embodiments, the IC layer 22 may be configured to receive and/or transmit signal that passes through the path P1 as shown in FIG. 1B. In some embodiments, the IC layer 22 may be configured to receive and/or transmit I/O signal that passes through the path P3 as shown in FIG. 1B.

In some embodiments, the electronic component 20-1 may include redistribution structures 24a, 24b, and 24c. Each of the redistribution structures 24a, 24b, and 24c includes a conductive trace(s), conductive pad(s), and/or conductive via(s) embedded in or disposed on the dielectric layer(s).

The redistribution structure 24a may be disposed between the surface 20-1s1 and the IC layer 22. The redistribution structure 24a may be adjacent to the surface 20-1s1 of the electronic component 20-1. The redistribution structure 24a may be configured to receive and/or transmit I/O signal that passes through the path P3 as shown in FIG. 1B. The redistribution structure 24b may be disposed between the surface 20-1s2 and the IC layer 22. The redistribution structure 24b may be adjacent to the surface 20-1s2 of the electronic component 20-1. The redistribution structure 24b may be configured to receive power that passes through the path P2 as shown in FIG. 1B. The redistribution structure 24c may be disposed between the surface 20-1s2 and the IC layer 22. The redistribution structure 24c may be adjacent to the surface 20-1s2 of the electronic component 20-1. The redistribution structure 24c may be configured to receive and/or transmit signal (e.g., non-power signal) that passes through the path P1 as shown in FIG. 1B. Although not illustrated in FIG. 2, the electronic component 20-1 may include redistribution structures between the IC layer 22 and redistribution structure 24a as well as between the IC layer 22 and redistribution structure 24b.

In some embodiments, the redistribution structures 24a, 24b, and 24c may have different dimensions. In some embodiments, the line width/line space (L/S) of the redistribution structure 24c may be less than that of the redistribution structure 24a. For example, the conductive layer(s), conductive trace(s), conductive pad(s), and/or conductive via(s) of the redistribution structure 24c may have a dimension (e.g., width, diameter and/or surface area) less than that of the conductive layer(s), conductive trace(s), conductive pad(s), and/or conductive via(s) of the redistribution structure 24a. In some embodiments, the L/S of the redistribution structure 24a may be less than that of the redistribution structure 24b. For example, the conductive layer(s), conductive trace(s), conductive pad(s), and/or conductive via(s) of the redistribution structure 24a may have a dimension (e.g., width, diameter and/or surface area) less than that of the conductive layer(s), conductive trace(s), conductive pad(s), and/or conductive via(s) of the redistribution structure 24b.

In some embodiments, the redistribution structures 24a, 24b, and 24c may have different densities (e.g., the number of conductive elements per unit area). In some embodiments, the density of the redistribution structure 24c may be greater than that of the redistribution structure 24a. For example, the conductive layer(s), conductive trace(s), conductive pad(s), and/or conductive via(s) of the redistribution structure 24c may have a density greater than that of the conductive layer(s), conductive trace(s), conductive pad(s), and/or conductive via(s) of the redistribution structure 24a. In some embodiments, the density of the redistribution structure 24a may be greater than that of the redistribution structure 24b. For example, the conductive layer(s), conductive trace(s), conductive pad(s), and/or conductive via(s) of the redistribution structure 24a may have a density greater than that of the conductive layer(s), conductive trace(s), conductive pad(s), and/or conductive via(s) of the redistribution structure 24b.

In some embodiments, the electronic component 20-1 may include terminals 26a, 26b, and 26c. In some embodiments, the terminals 26a may be disposed on or under the surface 20-1s1 of the electronic component 20-1 and electrically connected to the redistribution structure 24a. The terminals 26a may be electrically connected to the carrier 10 as shown in FIG. 1B. In some embodiments, the terminals 26b may be disposed on or over the surface 20-1s2 of the electronic component 20-1 and electrically connected to the redistribution structure 24b. The terminals 26b may be electrically connected to, for example, the power regulating circuit 32a-1 as shown in FIG. 1B. In some embodiments, the terminals 26c may be disposed on or over the surface 20-1s2 of the electronic component 20-1 and electrically connected to the redistribution structure 24c. The terminals 26c may be electrically connected to, for example, the interconnection circuit 32b-1 as shown in FIG. 1B. In some embodiments, the terminals 26a, 26b, and 26c may have the same dimension. In other embodiments, the terminals 26a, 26b, and 26c may have different dimensions based on design requirements.

In some embodiments, the densities of the terminals 26a, 26b, and 26c may be positively proportional to the densities of the redistribution structures 24, 24b, and 24c, respectively. In some embodiments, the terminals 26a, 26b, and 26c may have different densities. In some embodiments, the density of the terminals 26c may be greater than that of the terminals 26a. In some embodiments, the density of the terminals 26a may be greater than that of the terminals 26b. In some embodiments, the density of the terminals 26c may be greater than that of the terminals 26b. In some embodiments, the terminals 26a, 26b, and 26c may have different pitches. In some embodiments, the pitch of the terminals 26c may be less than that of the terminals 26a. In some embodiments, the pitch of the terminals 26a may be less than that of the terminals 26b.

Since power transmission and signal transmission have different requirements in terms of electrical properties (e.g., capacitance, data transmission speed, and the like), such design can optimize the transmission efficiency of power and signal, which thereby improves the performance of the electronic device 1a.

Figure 3:
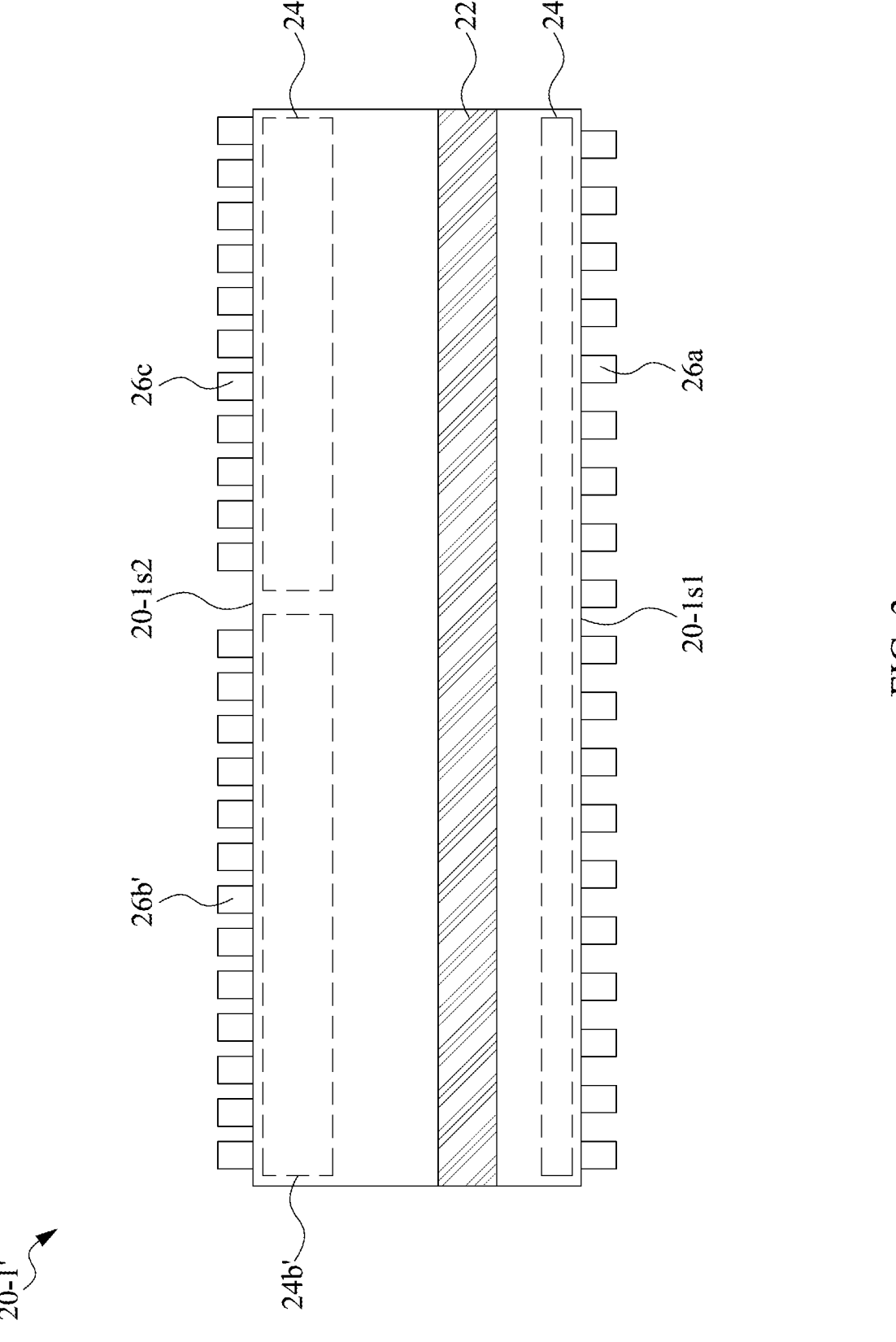
FIG. 3 illustrates a cross-sectional view of an electronic component according to some embodiments of the present disclosure.

FIG. 3 illustrates a cross-sectional view of an electronic component 20-1' according to some embodiments of the present disclosure. The electronic component 20-1' may be similar to the electronic component 20-1, with differences therebetween as follows.

In some embodiments, the electronic component 20-1' may include a redistribution structure 24b'. The redistribution structure 24b' may be disposed between the surface 20-1s2 and the IC layer 22. The redistribution structure 24b' may be adjacent to the surface 20-1s2 of the electronic component 20-1'. The redistribution structure 24b' may be configured to receive power that passes through the path P2 as shown in FIG. 1B.

In some embodiments, the L/S of the redistribution structure 24b' may be substantially equal to that of the redistribution structure 24c. For example, the conductive layer(s), conductive trace(s), conductive pad(s), and/or conductive via(s) of the redistribution structure 24b' may have a dimension (e.g., width, diameter and/or surface area) substantially equal to that of the conductive layer(s), conductive trace(s), conductive pad(s), and/or conductive via(s) of the redistribution structure 24c. In some embodiments, the L/S of the redistribution structure 24b' may be less than that of the redistribution structure 24a. For example, the conductive layer(s), conductive trace(s), conductive pad(s), and/or conductive via(s) of the redistribution structure 24b' may have a dimension (e.g., width, diameter and/or surface area) less than that of the conductive layer(s), conductive trace(s), conductive pad(s), and/or conductive via(s) of the redistribution structure 24a.

In some embodiments, the electronic component 20-1' may include terminals 26b'. In some embodiments, the terminals 26b' may be disposed on or over the surface 20-1s2 of the electronic component 20-1' and electrically connected to the redistribution structure 24b'. The terminals 26b' may be electrically connected to, for example, the power regulating circuit 32a-1 as shown in FIG. 1B. In some embodiments, the density of the terminals 26b' may be substantially equal to that of the terminals 26c. In some embodiments, the density of the terminals 26b' may be greater than that of the terminals 26a. In some embodiments, the pitch of the terminals 26b' may be substantially equal to that of the terminals 26c. In some embodiments, the pitch of the terminals 26b' may be less than that of the terminals 26a.

Such design can improve the yield of manufacturing the electronic component 20-1 (and electronic components 20-2 to 20-5) and reduce the cost of manufacturing.

Figure 4:
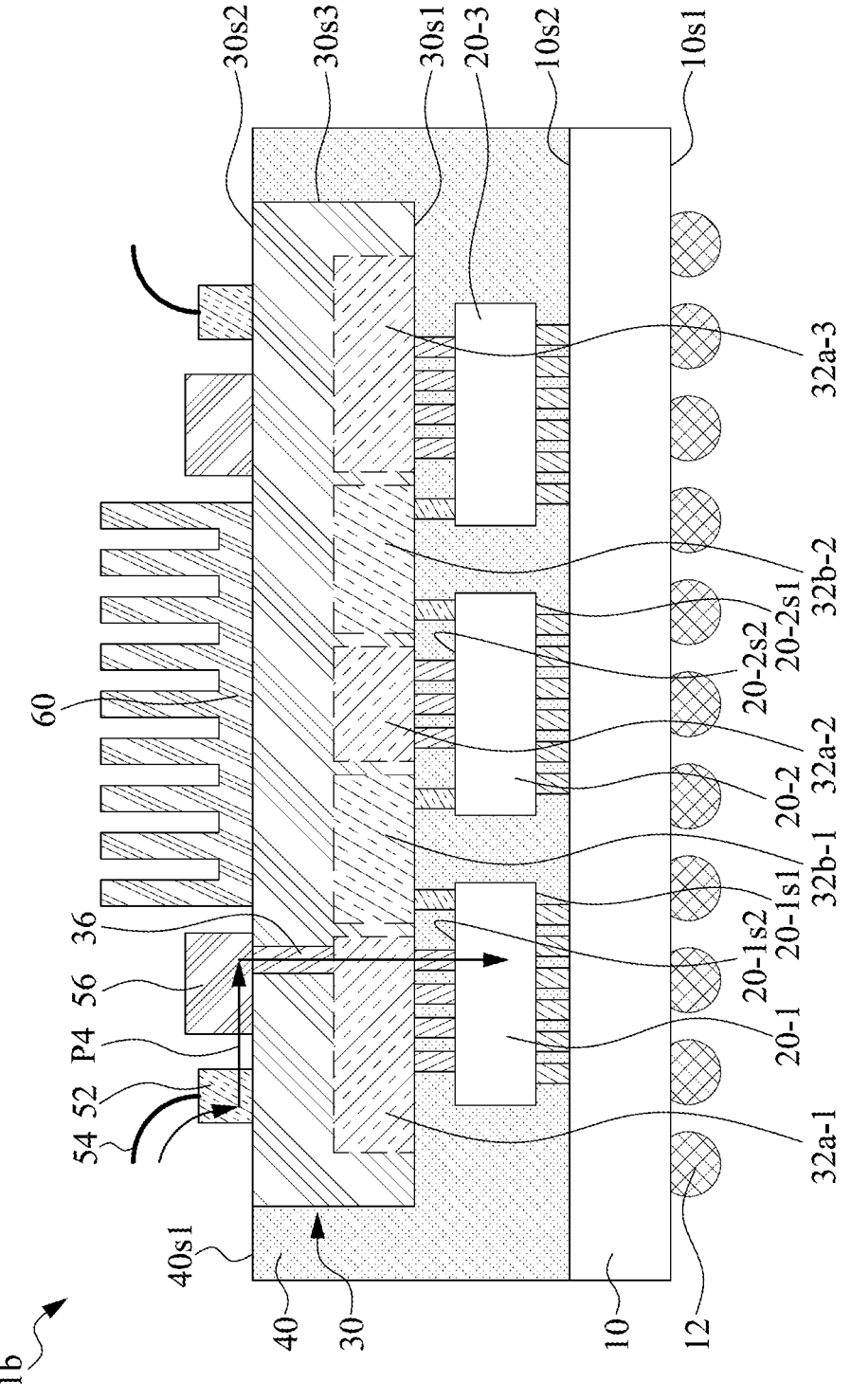
FIG. 4 illustrates a cross-sectional view of an electronic device according to some embodiments of the present disclosure.

FIG. 4 illustrates a cross-sectional view of an electronic device 1b according to some embodiments of the present disclosure. The electronic device 1b may be similar to the electronic device 1a, with differences therebetween as follows.

In some embodiments, the electronic device 1b may include an electrical connector 52, a cable 54, a power regulating element 56, and a heat dissipating element 60.

The electrical connector 52 may be disposed on or over the surface 30s2 of the semiconductor die 30. In some embodiments, a power supply unit (not shown), such as an alternating current (AC)-to-Direct Current (DC) (AC/DC) converter and a DC-to-DC (DC/DC) converter, may be configured to provide power to the electrical connector 52 through the cable 54.

The cable 54 may include an Ethernet cable, a flexible flat cable (FFC), an insulated wire having a protective casing, or another suitable wired connection. In some embodiments, a flexible printed circuit (FPC) may be used in place of the cable 54 to provide power. The cable 54 may have one end connected to the power supply unit and another end connected to the electrical connector 52. In other embodiments, the cable 54 may be replaced by other suitable elements, such as a wire (e.g., bonding wire).

In some embodiments, the power regulating element 56 may be disposed on or over the surface 30s2 of the semiconductor die 30. The power regulating element 56 may be electrically connected to the semiconductor die 30 using a flip-chip or wire-bond technique. In some embodiments, the power regulating element 56 may include a power management integrated circuit (PMIC). In some embodiments, the power regulating element 56 may include a voltage regulator, such as a linear regulator (which is configured to maintain a constant output voltage) or a switching regulator (which is configured to generate an output voltage higher than or lower than an input voltage). In some embodiments, the power regulating element 56 may include a step-down (buck) converter, a step-up (boost) converter, an analog-to-digital converter, a digital-to-analog converter, an AC/DC converter, a DC/DC converter, other types of converters, or a combination thereof. In some embodiments, the power regulating element 56 may receive the input power from the electrical connector 52, regulate the input power, and in turn provide regulated power (which may range between about 0.6-1.0 volts) to the electronic components 20-1, 20-2, and 20-3 through the power regulating circuits 32a-1, 32a-2, and 32a-3.

In some embodiments, the semiconductor die 30 may include a conductive structure 36. In some embodiments, the conductive structure 36 may extend between the power regulating element 56 and the power regulating circuit 32a-1 (or 32a-2 or 32a-3). In some embodiments, the conductive structure 36 may be configured to electrically connect the power regulating element 56 and the power regulating circuit 32a-1 (or 32a-2 or 32a-3). In some embodiments, the conductive structure 36 may be disposed within the rigid region 34 as shown in FIG. 1B. In some embodiments, the conductive structure 36 may be configured to receive and/or transmit power regulated by the power regulating element 56. In some embodiments, the conductive structure 36 may include at least one conductive via, a redistribution structure, or other suitable elements.

In some embodiments, the power regulating element 56 may partially overlap vertically with the power regulating circuit 32a-1 (or 32a-2 or 32a-3), which thereby reduces the transmission path of power. In some embodiments, the power regulating element 56 may partially overlap vertically with the electronic component 20-1 (or 20-2 or 20-3), which thereby reduces the transmission path of power.

In some embodiments, a path P4 (e.g., a power path) may pass through the cable 54, the electrical connector 52, the power regulating element 56, the conductive structure 36, the power regulating circuit 32a-1 (or 32a-2 or 32a-3), and the electronic component 20-1 (or 20-2 or 20-3). In some embodiments, the regulated power, regulated by the power regulating element 56, may enter the semiconductor die 30 from the surface 30s2. Such arrangement may facilitate power transmission, and the communication between chips (e.g., the electronic components 20-1 and 20-2) may be free from interference by power transmission.

In some embodiments, the heat dissipating element 60 may be disposed on or disposed over the surface 30s2 of the semiconductor die 30. The heat dissipating element 60 may at least partially overlap with the electronic component 20-1 (or 20-2 or 20-3) in a direction substantially perpendicular to the surface 30s2 of the semiconductor die 30. The heat dissipating element 60 may include a heat sink, such as heat dissipation fins as shown, extending along directions substantially perpendicular to the surface 30s2 of the semiconductor die 30 from a base portion. The heat dissipating element 60 may be configured to facilitate dissipating heat from at least one of the electronic components 20-1 to 20-3 to an external space of the electronic device 1b.

Figure 5:
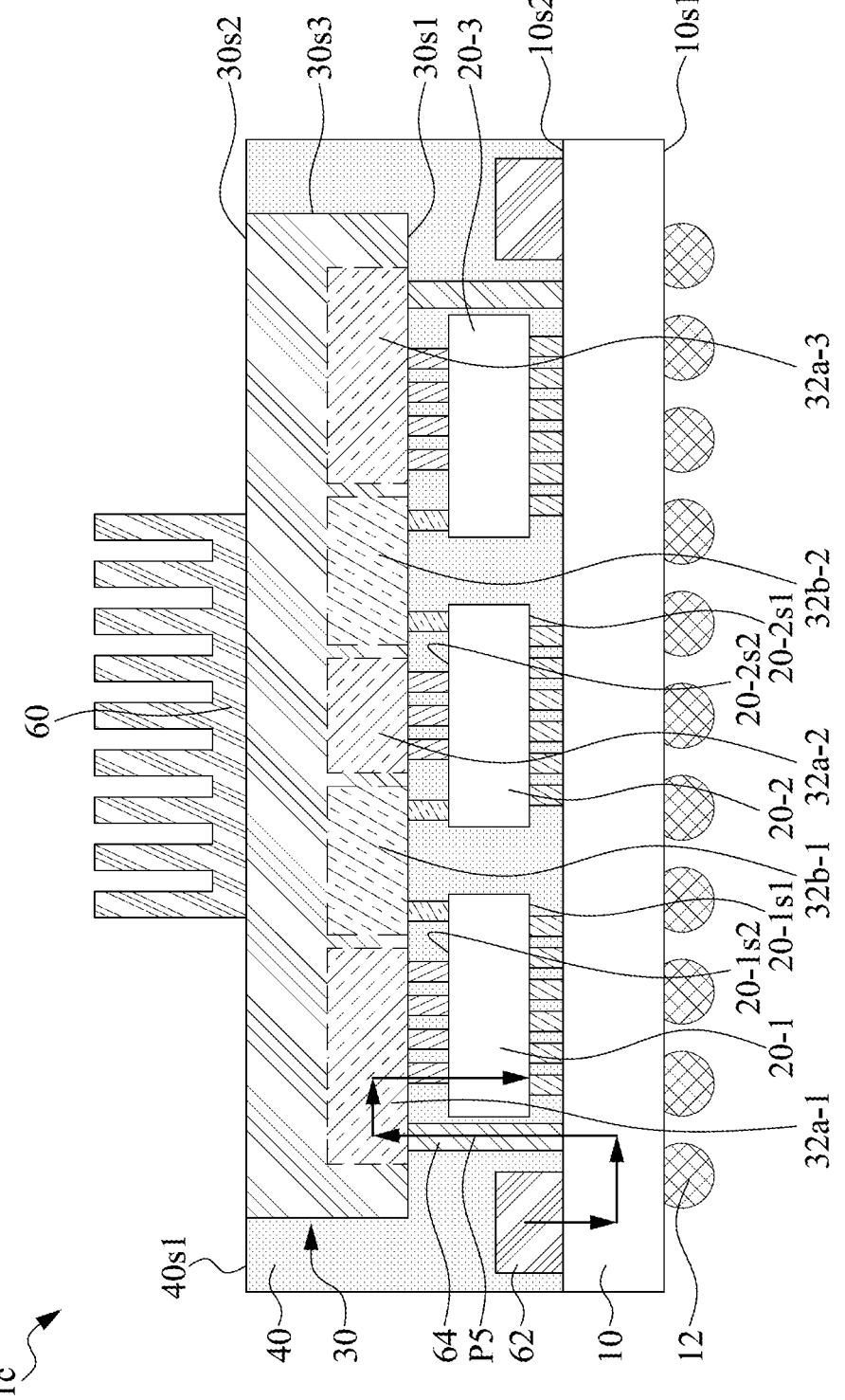
FIG. 5 illustrates a cross-sectional view of an electronic device according to some embodiments of the present disclosure.

FIG. 5 illustrates a cross-sectional view of an electronic device 1c according to some embodiments of the present disclosure. The electronic device 1c may be similar to the electronic device 1b, with differences therebetween as follows.

In some embodiments, the electronic device 1c may include a power regulating element 62 and a conductive structure 64. In some embodiments, the power regulating element 62 may be disposed on or over the surface 10s2 of the carrier 10. In some embodiments, the power regulating element 62 may be encapsulated by the encapsulant 40. The power regulating element 62 may be electrically connected to the carrier 10 using a flip-chip or wire-bond technique. In some embodiments, the power regulating element 62 may include a PMIC. In some embodiments, the power regulating element 62 may include a voltage regulator, such as a linear regulator (which is configured to maintain a constant output voltage) or a switching regulator (which is configured to generate an output voltage higher than or lower than an input voltage). In some embodiments, the power regulating element 62 may include a step-down (buck) converter, a step-up (boost) converter, an analog-to-digital converter, a digital-to-analog converter, an AC/DC converter, a DC/DC converter, other types of converters, or a combination thereof. In some embodiments, the power regulating element 62 may receive the input power from the carrier 10, regulate the input power, and provide regulated power (which may range between about 0.6-1.0 volts) to the electronic components 20-1, 20-2, and 20-3 through the power regulating circuits 32a-1, 32a-2, and 32a-3. In this embodiment, the semiconductor die 30 is located over the electronic component 20-1 and has an edge (e.g., surface 30s3) exceeding a lateral surface of the electronic component 20-1. Thus, the carrier 10 can provide a space, under the semiconductor die 30, for disposing an additional power regulating element (e.g., 62). Further, the additional power regulating elements (e.g., 62) may be stacked along a Z-direction, defined as a direction from the surface 10s1 toward the surface 10s2. As a result, the size along an X-Y plane, defined as a plane parallel to the surface 10s2, of the electronic device 1c can be reduced.

In some embodiments, the conductive structure 64 may extend between the surface 30s1 of the semiconductor die 30 and the surface 10s2 of the carrier 10. In some embodiments, the conductive structure 64 may be encapsulated by the encapsulant 40. The conductive structure 64 may be electrically connected to the power regulating element 62. The conductive structure 64 may be electrically connected to the power regulating circuit 32a-1 (or 32a-2 or 32a-3). In some embodiments, the conductive structure 64 may include a conductive pillar or other suitable components.

In some embodiments, a path P5 (e.g., a power path) may pass through the power regulating element 62, the conductive structure 64, the power regulating circuit 32a-1 (or 32a-2 or 32a-3), and the electronic component 20-1 (or 20-2 or 20-3). In some embodiments, the regulated power, regulated by the power regulating element 62, may enter the semiconductor die 30 from the surface 30s1. Such arrangement may utilize the remaining space not occupied by the electronic components 20-1, 20-2, and 20-3, which may reduce the size (e.g., the thickness) of the electronic device 1c.

Figure 6:
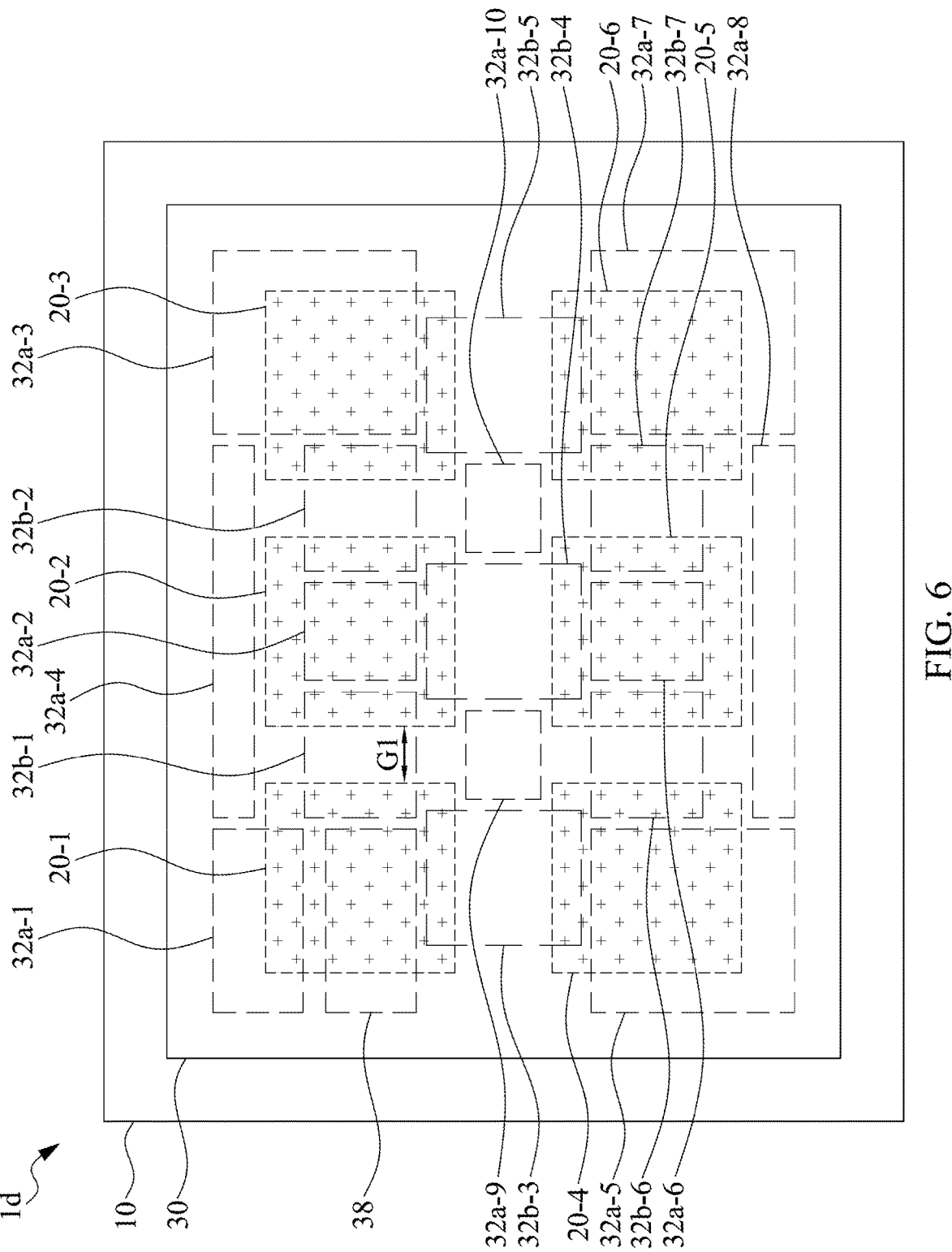
FIG. 6 illustrates a top view of an example electronic device according to some embodiments of the present disclosure.

FIG. 6 illustrates a top view of an example electronic device 1d according to some embodiments of the present disclosure. The electronic device 1d may be similar to the electronic device 1a, with differences therebetween as follows.

In some embodiments, the semiconductor die 30 may include a data storage circuit 38. The data storage circuit 38 may include a non-transitory memory or a non-volatile memory (such as a flash memory and a read-only memory (ROM)) or a volatile memory (such as a Dynamic Random Access Memory (DRAM)). In some embodiments, the data storage circuit 38 may include a high bandwidth memory (HBM). In some embodiments, the data storage circuit 38 may be configured to be accessed by the electronic components 20-1- to 20-6. In some embodiments, the data storage circuit 38 may be electrically connected to the electronic components 20-1- to 20-6. The data storage circuit 38 may be configured to support data storage and retrieval operations with the electronic components 20-1 to 20-6. The number of data storage circuits 38 may be determined based, for example, on budget for power, cost, heat, and/or capacity. In some embodiments, the data storage circuit 38 may also include a memory controller to manage access to the memory IC and provide memory management and maintenance. In such embodiments, the data storage circuit 38 can be integrated within the semiconductor die 30, which thereby reduces the size of the electronic device 1d.

Figure 7:
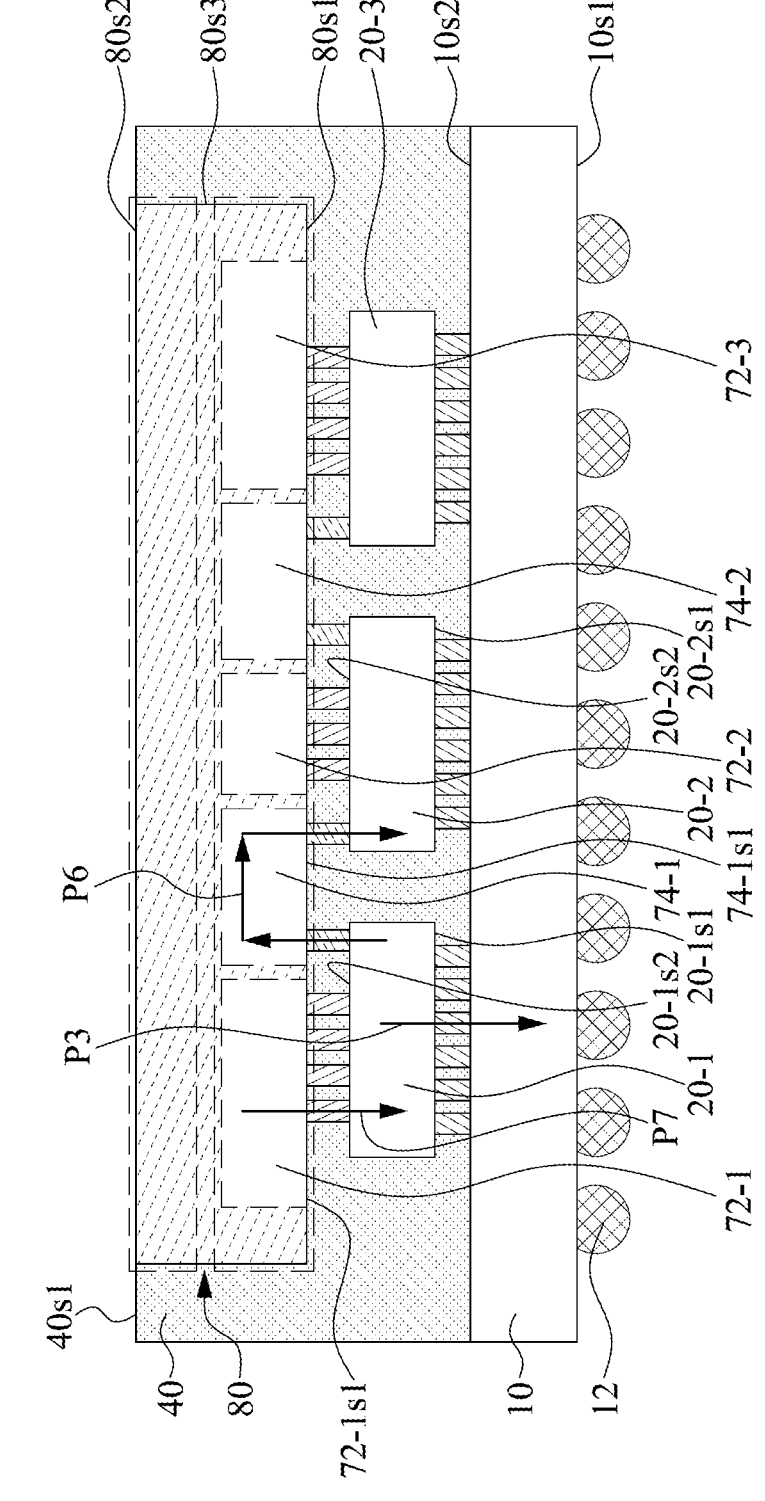
FIG. 7 illustrates a cross-sectional view of an electronic device according to some embodiments of the present disclosure.

FIG. 7 illustrates a cross-sectional view of an electronic device 1e according to some embodiments of the present disclosure. The electronic device 1e may be similar to the electronic device 1a, with differences therebetween as follows.

In some embodiments, the electronic device 1e may include electronic components 72-1, 72-2, and 72-3 as well as electronic components 74-1 and 74-2. Each of the electronic components 72-1, 72-2, and 72-3 may be disposed over the electronic components 20-1, 20-2, and/or 20-3. In some embodiments, the electronic components 72-1, 72-2, and 72-3 may be connected to the electronic components 20-1 to 20-3 by a surface mount technology (SMT). In some embodiments, the electronic components 72-1, 72-2, and 72-3 may be connected to the electronic components 20-1 to 20-3 by a solder bonding(s), a hybrid bonding(s) which involves a bonding between metal and metal (e.g., copper to copper). Each of the electronic components 72-1, 72-2, and 72-3 may include a semiconductor die, which includes a circuit structure. Each of the electronic components 72-1, 72-2, and 72-3 may include a power regulating circuit, a capacitor, an inductor, or other suitable circuits. Each of the electronic components 72-1, 72-2, and 72-3 may function as an interposer that is included in a power path. In some embodiments, electronic components 72-1, 72-2, and 72-3 may be configured to provide the electronic components 20-1, 20-2, and 20-3 with a regulated power. In some embodiments, the electronic components 72-1, 72-2, and 72-3 may be configured to electrically connect the electronic components 20-1, 20-2, and/or 20-3. The electronic component 72-1 may include a surface 72-1$s$1 (or a lower surface or a front surface). In some embodiments, the surface 72-1$s$1 of the electronic component 72-1 may be configured to transmit power (or power signal) to the electronic component 20-1.

Each of the electronic components 74-1 and 74-2 may be disposed over the electronic components 20-1, 20-2, and/or 20-3. Each of the electronic components 74-1 and 74-2 may include a semiconductor die. Each of the electronic components 74-1 and 74-2 may function as an interposer that is included in a signal path. Each of the electronic components 74-1 and 74-2 may include a bridge die or an interconnection circuit. In some embodiments, the electronic components 74-1 and 74-2 may be configured to provide the electronic components 20-1, 20-2, and 20-3 with a non-power signal. In some embodiments, the electronic components 74-1 and 74-2 may be configured to electrically connect the electronic component 20-1, 20-2, and/or 20-3. The electronic component 74-1 may include a surface 74-1$s$1 (or a lower surface or a front surface). In some embodiments, the surface 74-1$s$1 of the electronic component 74-1 may be configured to transmit a non-power signal between the electronic components 20-1 and 20-2.

In some embodiments, the electronic device 1$e$ may include an encapsulant 80. The encapsulant 80 may encapsulate the electronic components 72-1, 72-2, and 72-3 as well as electronic components 74-1 and 74-2. For example, the upper surfaces and lateral surface (not annotated) of the electronic components72-1, 72-2, and 72-3 as well as electronic components 74-1 and 74-2 may be covered by the encapsulant 80. The encapsulant 80 may include a surface 80$s$1 (or a lower surface), a surface 80$s$2 (or an upper surface), and a surface 80$s$3 (or a lateral surface). The surface 80$s$1 of the encapsulant 80 may be covered by the encapsulant 40. The surface 80$s$3 of the encapsulant 80 may be covered by the encapsulant 40. The surface 80$s$2 of the encapsulant 80 may be substantially aligned with the surface 40$s$1 of the encapsulant 40. The encapsulant 80 may include insulation or dielectric material. In some embodiment, the encapsulant 80 may be made of molding material that may include, for example, a Novolac-based resin, an epoxy-based resin, a silicone-based resin, or other another suitable encapsulant. Suitable fillers may also be included, such as powdered $SiO_2$. In this embodiment, the encapsulant 80 over the electronic components 72-1 to 72-3 as well as electronic components 74-1 and 74-2 may function as a rigid region configured to support the electronic components 72-1 to 72-3 as well as electronic components 74-1 and 74-2.

The electronic components 74-1 (or 74-2) may be configured to provide a path P6. The path P6 may be a non-power path. In some embodiments, the path P6 may pass through the backside surfaces of the electronic components 20-1 to 20-6. In some embodiments, the path P6 may pass through the front surfaces of the electronic components 74-1 and 74-2. For example, the path P6 may pass through the surface 74-1$s$1 of the electronic component 74-1.

The electronic components 72-1, 72-2, and 72-3 may be configured to provide a path P7. The path P7 may be a power path. In some embodiments, the path P7 may pass through the backside surfaces of the electronic components 20-1 to 20-6. In some embodiments, the path P7 may pass through the front surfaces of the electronic components 72-1, 72-2, and 72-3. For example, the path P7 may pass through the surface 72-1$s$1 of the electronic component 72-1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure that are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:

a first electronic component having a front surface and a backside surface opposite to the front surface; and an integrated circuit configured to provide the first electronic component with a power signal through the backside surface of the first electronic component and configured to bridge a non-power signal between the first electronic component and a second electronic component, wherein the integrated circuit comprises a power regulating circuit, and wherein the integrated circuit comprises an interconnection circuit adjacent to the power regulating circuit, the interconnection circuit is configured to bridge the first electronic component and the second electronic component, the first electronic component comprises first terminals and second terminals adjacent to the backside surface of the first electronic component, the first terminals are disposed under the power regulating circuit and have a first density, and the second terminals are disposed under the interconnection circuit and have a second density greater than the first density.

2. The electronic device of claim 1, wherein the integrated circuit comprises a data storage circuit electrically connected to the first electronic component.

3. The electronic device of claim 1, wherein the power regulating circuit comprises a first portion that is not overlapping at least one of the first electronic component and the second electronic component.

4. The electronic device of claim 3, wherein the power regulating circuit comprises a second portion adjacent to at least two sides of the interconnection circuit from a top view.

* * * * *